US008980650B2

(12) United States Patent
Oguz et al.

(10) Patent No.: US 8,980,650 B2
(45) Date of Patent: Mar. 17, 2015

(54) PERPENDICULAR MTJ STACKS WITH MAGNETIC ANISOTROPY ENHANCING LAYER AND CRYSTALLIZATION BARRIER LAYER

(71) Applicants: Kaan Oguz, Dublin (IE); Mark L. Doczy, Portland, OR (US); Brian Doyle, Portland, OR (US); Uday Shah, Portland, OR (US); David L. Kencke, Beaverton, OR (US); Roksana Golizadeh Mojarad, San Jose, CA (US); Robert S. Chau, Beaverton, OR (US)

(72) Inventors: Kaan Oguz, Dublin (IE); Mark L. Doczy, Portland, OR (US); Brian Doyle, Portland, OR (US); Uday Shah, Portland, OR (US); David L. Kencke, Beaverton, OR (US); Roksana Golizadeh Mojarad, San Jose, CA (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/454,682

(22) Filed: Aug. 7, 2014

(65) Prior Publication Data

US 2014/0349415 A1 Nov. 27, 2014

Related U.S. Application Data

(62) Division of application No. 13/627,968, filed on Sep. 26, 2012, now Pat. No. 8,836,056.

(51) Int. Cl.
*H01L 21/00* (2006.01)
*H01L 43/12* (2006.01)
*H01L 43/08* (2006.01)
(Continued)

(52) U.S. Cl.
CPC .................. *H01L 43/12* (2013.01); *H01L 29/82* (2013.01); *H01L 27/228* (2013.01); *H01L 43/10* (2013.01); *H01F 10/3254* (2013.01); *H01L 27/226* (2013.01); *H01L 43/08* (2013.01); *H01F 10/1933* (2013.01); *G11C 11/16* (2013.01)
USPC .................. 438/3; 438/10; 438/663; 438/666; 257/295; 257/421; 257/E21.002; 257/E29.003

(58) Field of Classification Search
CPC .......... H01L 43/08; H01L 43/10; H01L 43/12; H01L 27/228; H01L 27/226; H01L 29/66984; H01L 29/82; H01F 10/3254; H01F 10/3286; H01F 10/1933; G11C 11/16
USPC ................ 438/3, 10, 663, 666; 257/295, 421, 257/E21.002, E29.003
See application file for complete search history.

(56) References Cited

U.S. PATENT DOCUMENTS 6,166,948 A * 12/2000 Parkin et al. ................... 365/173
2010/0140726 A1    6/2010 Apalkov et al.
(Continued)

OTHER PUBLICATIONS

International Search Report and Written Opinion mailed Dec. 19, 2013 for PCT/US2013/058092 filed Sep. 4, 2013.

*Primary Examiner* — Thinh T Nguyen
(74) *Attorney, Agent, or Firm* — Blakely, Sokoloff, Taylor & Zafman LLP (57) ABSTRACT

Magnetic tunnel junctions (MTJ) suitable for spin transfer torque memory (STTM) devices, include perpendicular magnetic layers and one or more anisotropy enhancing layer(s) separated from a free magnetic layer by a crystallization barrier layer. In embodiments, an anisotropy enhancing layer improves perpendicular orientation of the free magnetic layer while the crystallization barrier improves tunnel magnetoresistance (TMR) ratio with better alignment of crystalline texture of the free magnetic layer with that of a tunneling layer.

5 Claims, 7 Drawing Sheets

(51) Int. Cl.
- *H01L 29/82* (2006.01)
- *H01L 27/22* (2006.01)
- *H01L 43/10* (2006.01)
- *H01F 10/32* (2006.01)
- *H01F 10/193* (2006.01)
- *G11C 11/16* (2006.01)

(56) References Cited

U.S. PATENT DOCUMENTS

| | | |
|---|---|---|
| 2010/0220516 A1 | 9/2010 | Lee et al. |
| 2012/0023386 A1 | 1/2012 | Oh et al. |
| 2012/0135273 A1 | 5/2012 | Horng et al. |
| 2012/0205758 A1 | 8/2012 | Jan et al. |

* cited by examiner

PERPENDICULAR MTJ STACKS WITH MAGNETIC ANISOTROPY ENHANCING LAYER AND CRYSTALLIZATION BARRIER LAYER

This is a Divisional application of Ser. No. 13/627,968 filed Sep. 26, 2012, which is presently pending.

TECHNICAL FIELD

Embodiments of the invention are in the field of memory devices and, in particular, a magnetic tunnel junction (MTJ) for spin transfer torque memory (STTM) devices.

BACKGROUND

STTM devices are non-volatile memory devices that utilize a phenomenon known as tunnelling magnetoresistance (TMR). For a structure including two ferromagnetic layers separated by a thin insulating tunnel layer, it is more likely that electrons will tunnel through the tunnel layer when magnetizations of the two magnetic layers are in a parallel orientation than if they are not (non-parallel or antiparallel orientation). As such, an MTJ can be switched between two states of electrical resistance, one state having a low resistance and one state with a high resistance. The greater the differential in resistance, the higher the TMR ratio ($R_{AP}-R_P/R_P*100$ where $R_P$ and $R_{AP}$ are resistances for parallel and antiparallel alignment of the magnetizations, respectively) and the more readily a bit can be reliably stored in association with the MTJ resistive state. The TMR ratio of a given MTJ is therefore an important performance metric of an STTM.

For an STTM device, current-induced magnetization switching is used to set the bit states. Polarization states of one ferromagnetic layer are switched relative to a fixed polarization of the second ferromagnetic layer via the spin transfer torque phenomenon, enabling states of the MTJ to be set by application of current. Upon passing a current through the fixed magnetic layer, angular momentum (spin) of the electrons is polarized along the direction of the magnetization of the fixed layer. These spin polarized electrons transfer their spin angular momentum to the magnetization of the free layer and cause it to precess. As such, the magnetization of the free magnetic layer can be switched by a pulse of current (e.g., in about 1 nano-second) exceeding a certain critical value with magnetization of the fixed magnetic layer remains unchanged as long as the current pulse is below a higher threshold attributable to a different geometry, an adjacent pinning layer, different coercivity ($H_c$), etc.

MTJs with magnetic electrodes having a perpendicular (out of plane of substrate) magnetic easy axis have a potential for realizing higher density memory than in-plane variants. Generally, perpendicular magnetic anisotropy (PMA) can been achieved in the free magnetic layer in the presence of interfacial perpendicular anisotropy established by an adjacent layer, such as MgO, when free magnetic layer is sufficiently thin. This structure however is associated with greater thermal instability, which can significantly shorten the non-volatile lifetime of a memory element. PMA can also be achieved through coupling to a strongly perpendicular film disposed adjacent to the free layer. While thermal stability is improved with this structure, TMR ratio tends to be low due to crystal mismatch.

Perpendicular MTJ structures and formation techniques capable of achieving both a high TMR ratio and good thermal stability are therefore advantageous.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Spin transfer torque memory (STTM) devices with anisotropy enhancing layers and crystallization barrier layers are described. In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer or component with respect to other layers or components. For example, one layer disposed over (above) or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

Figure 1A:
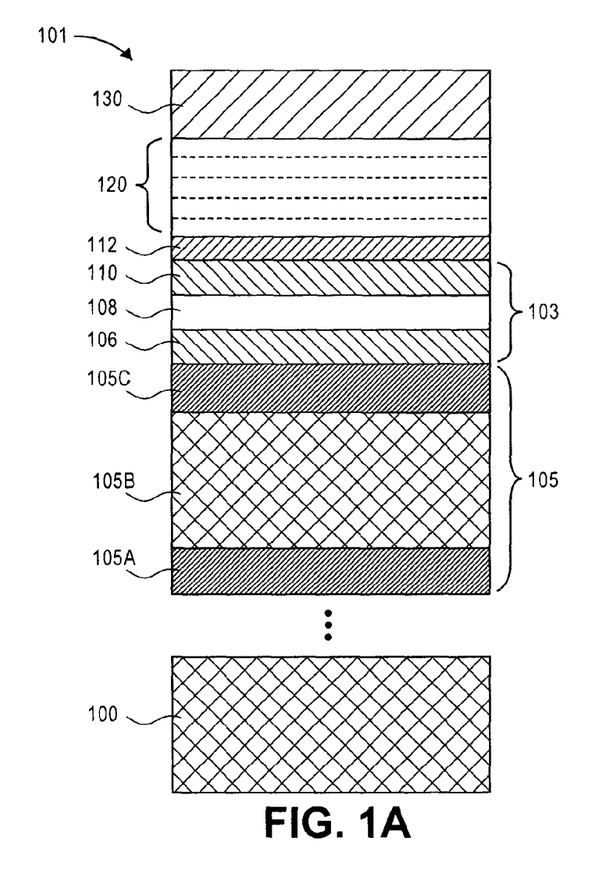
FIG. 1A illustrates a cross-sectional view of a material layer stack for a perpendicular STTM device, in accordance with an embodiment of the present invention.
Figure 1B:
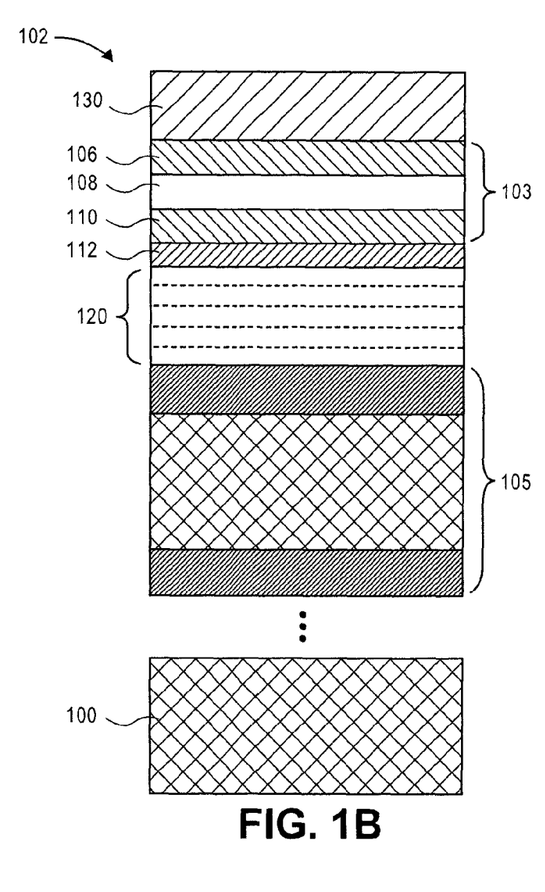
FIG. 1B illustrates a cross-sectional view of a material layer stack for a perpendicular STTM device, in accordance with an embodiment of the present invention.

In embodiments, an STTM device includes at least one magnetic anisotropy enhancing layer (AEL) separated from an MTJ by a crystallization barrier layer. FIG. 1A illustrates a cross-sectional view of a material layer stack 101 for one such STTM device, in accordance with an embodiment of the present invention. The material layer stack 101 is formed over a substrate thin film layer 100, preferably amorphous, such as, but not limited to silicon dioxide or comparable dielectric. The stack 101 generally includes a first contact metallization 105, an MTJ STRUCTURE 103, a magnetic anisotropy enhancing layer (AEL) 120, a crystallization barrier layer 112 disposed there between, and a second contact metallization 130. Notably, the order of the material layers disposed between the metallization layers 105, 130 may be inverted as is illustrated in FIG. 1B providing a cross-sectional view of a material layer stack 102, in accordance with another embodiment. Layers depicted in FIG. 1B having a same function and material properties as those in FIG. 1A are identified with a same reference number. As shown for the stack 102, the AEL 120 is on the first contact metallization 105 with the crystallization barrier layer 112 disposed on the AEL 120 and the MTJ STRUCTURE 103 disposed over the crystallization barrier layer 112.

The contact metallization layers 105 and 130 are each of a material or stack of materials operable for electrically contacting magnetic electrodes of a STTM device, and may be any material or stack of materials known in the art for such a purpose. Although the metallization layers 105, 130 may have a range of thicknesses (e.g., 5 nm-50 nm) and include a variety of materials to form a compatible interface with both the STTM device and interconnects, in the exemplary embodiment the interconnect metallization 105 includes at least a tantalum (Ta) layer 105C and is illustrated with an additional underlying conductive buffer further including at least one ruthenium (Ru) layer 105B and a second Ta layer 105A. For the capping metallization 130, a metal having high conductivity even if oxidized at the surface is advantageous, such as, but not limited to, Cu, Al, Ru, Au, etc, with Ru advantageously providing a good barrier of oxygen, reducing the possibility of oxidation within the MTJ STRUCTURE 103.

As further illustrated, disposed over the contact metallization 105 is an out-of-plane, or "perpendicular," anisotropic epitaxial MTJ structure 103 including the fixed magnetic layer 106, tunneling layer 108, and free magnetic layer 110. Generally, the fixed magnetic layer 106 is composed of a material or stack of materials suitable for maintaining a fixed magnetization direction while the free magnetic layer 110 is composed of a magnetically softer material or stack of materials (i.e. magnetization can easily rotate to parallel and anti-parallel state with respect to fixed layer). The tunneling layer 108 is composed of a material or stack of materials suitable for allowing current of a majority spin to pass through the layer, while impeding current of a minority spin (i.e., a spin filter). This enhances the tunneling magneto-resistance of the MTJ device.

In the exemplary embodiment, the MTJ structure 103 is based on a CoFeB/MgO system, having an MgO tunneling layer 108 and CoFeB layers 106, 110 all with (001) out-of-plane texture, where texture refers to the distribution of crystallographic orientations within in the layers of the MTJ structure. For embodiments described herein, a high percentage of crystals of the CoFeB/MgO/CoFeB structure 103 have the preferred (001) out-of-plane orientation (i.e., the degree of texture is high) for a TMR ratio of at least 100%. In one advantageous CoFeB/MgO embodiment, the (001) oriented CoFeB magnetic layers 106, 108 are iron-rich alloys (i.e., Fe>Co), such as, but not limited to, $Co_{20}Fe_{60}B_{20}$. In one such embodiment, both the fixed and free magnetic layers have an as-deposited composition of $Co_{20}Fe_{60}B_{20}$ with some loss of B occurring during solid phase epitaxial process occurring at elevated temperature (i.e., anneal) to transition to a desired bcc (001) texture from as-deposited amorphous or isotropic (non-textured) material states. As such, the magnetic layers 106 and 110 are best characterized as having ~20% Boron. Other embodiments with equal parts cobalt and iron are also possible (e.g., $Co_{40}Fe_{40}B_{20}$), as are lesser amounts of iron (e.g., $Co_{70}Fe_{10}B_{20}$). In still other embodiments the tunneling layer 108 composition serves as a suitable texture template but is other than MgO, for example aluminum oxide ($AlO_x$).

The tunneling layer 108 may have a thickness up to 2 nm, however resistance for a given device area generally increases exponentially with tunneling layer thickness. In exemplary MgO embodiments thicknesses below 1 nm provide advantageously low resistance with thickness between 1 nm and 1.3 nm also providing acceptably low resistance. Thickness of the fixed magnetic layer 106 may also vary considerably, for example between 1 nm and 2 nm. In embodiments, the thickness of the free magnetic layer 110 is over 1 nm (e.g., at least 1.1 nm) and exemplary iron-rich CoFeB embodiments of the free magnetic layer 110 have a thickness between 1.3 nm and 2 nm. This greater thickness improves thermal stability of the free magnetic layer 110, enabling longer non-volatile lifetimes of an STTM device relative to a free magnetic layer of lesser thickness (e.g., 1 nm, or less, for those systems relying interfacial anisotropy alone).

Although for the exemplary embodiment, the MTJ STRUCTURE 103 is disposed directly one the contact metallization 105 (e.g., with CoFeB fixed magnetic layer 106 directly on a Ta layer), it is noted an MTJ stack may vary considerably below the tunneling layer 108 without deviating from the scope of the embodiments of the present invention. For example, one or more intermediate layer may be disposed between the fixed magnetic layer 106 and adjacent contact metallization 105. For example, an anti-ferromagnetic layer, such as, but not limited to, iridium manganese (IrMn) or platinum manganese (PtMn), or a synthetic antiferromagnetic (SAF) structure including such an anti-ferromagnetic layer, adjacent to another ferromagnetic layer (e.g., CoFe) with a nonmagnetic spacer layer, such as, but not limited to Ru, intervening between the fixed magnetic layer 106 and the SAF, may be present for various purposes, such as pinning an interface of the fixed magnetic layer 106 (e.g., through exchange-bias coupling). As another example of variation in MTJ stack variation below the tunneling layer, the fixed magnetic layer 106 may further include a half-metallic material (e.g., Heusler alloy) at the interface with the tunneling layer 108.

In accordance with embodiments of the present invention, the stack 101 further includes the AEL 120. The AEL 120 may be a material layer or stack of material layers (represented by dashed lines in FIG. 1A) that couples to the free magnetic layer 110 to promote out-of-plane alignment within the free magnetic layer 110 of the greater thicknesses (i.e., greater than 1 nm) described elsewhere herein. For example, in one advantageous embodiment, the AEL 120 promotes out-of-plane alignment within an iron-rich CoFeB free magnetic layer 110 having a thickness of between 1.3 nm and 2.0 nm.

Figure 2A:
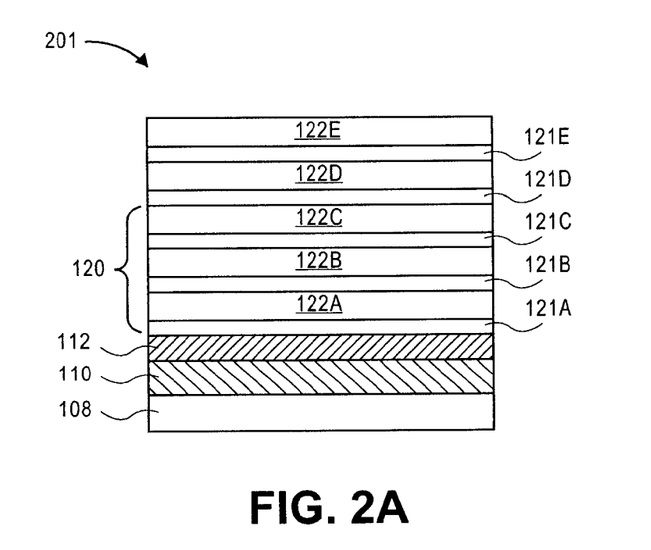
FIG. 2A illustrates an expanded cross-sectional view of a magnetic anisotropy enhancing layer disposed over a portion of a perpendicular MTJ, which is in a STTM device in accordance with an embodiment.

FIG. 2A illustrates an expanded cross-sectional view of an exemplary material stack 201 that includes multi-layered magnetic AEL 120 disposed over a portion of a perpendicular MTJ stack, which is employed in an STTM device in accordance with an embodiment. As shown in FIG. 2A, the AEL 120 is a bi-layer alternating between a magnetic material layer 121 and a non-magnetic material layer 122. With each bi-layer A, B, C, D, and E of the multi-layered AEL 120 representing one repetition, for five repeats or cycles, although such a bi-layer AEL may include 2 to 20 repetitions. In embodiments, the magnetic material layer 121 is composed of a ferromagnetic material, such as, but not limited to Co, Ni, Fe, or alloys thereof, with the exemplary embodiment being Co. Thickness of each magnetic material layer 121A, 121B, etc. may range between 0.2 and 2 nm. The non-magnetic material layer 122 may be composed of a non-magnetic metal, advantageously a noble metal such as, but not limited, to palladium (Pd), platinum (Pt), Ru, Au, or Ir, with the exemplary embodiment being Pd. Thickness of each non-magnetic material layer 122A, 122B, etc., is generally less than 2 nm, and more specifically between 0.2 nm and 2 nm for the exemplary Pd embodiment. Material layers with the AEL 120 may be strained with one or more of layers in the AEL 120 having fcc (111) orientation.

The inventors have found that while the presence of the AEL 120 advantageously enhances out-of-plane anisotropy of the free magnetic layer 110, crystal texture within the free magnetic layer 110 may tend to align to the crystal lattice of the layers with the AEL 120, rather than aligning to the tunneling layer 108 as a template in absence of the AEL 120. Such templating from the AEL 120 disadvantageously reduces the TMR ratio of a given stack. As the non-magnetic layer materials in the AEL generally have fcc (111) orientation, in the exemplary embodiment the magnetic material layer 121 is deposited in closest proximity to the free magnetic layer 110 (i.e., deposited before the non-magnetic material layer 122), which has been found to reduce the deleterious effect of the non-magnetic material with respect to out-of-plane anisotropy. As illustrated in FIG. 2A, the magnetic material layer 121A is deposited directly on the crystallization barrier layer 112.

In embodiments of the present invention, the STTM device layer stack 101 further includes the crystallization barrier layer 112 between the AEL 120 and the free magnetic layer 110. One function of the crystallization barrier layer 112 is to improve crystal alignment between the free magnetic layer 110 and the tunneling layer 108. It has been found that insertion of the crystallization barrier layer 112, when of proper microstructure, promotes much better grain alignment between the exemplary MgO tunneling layer 108 and a Fe-rich CoFeB free magnetic layer 110 than would otherwise occur in absence of a crystallization barrier. Although not bound by theory, it is currently thought that the crystallization barrier reduces or prevents templating of the free magnetic layer off the AEL 120, particularly where a non-magnetic fcc material is deposited first within the AEL 120. In embodiments, the crystallization barrier layer 112 has either bcc or amorphous structure to best promote bcc (001) structure within the CoFeB free magnetic layer 110. The barrier, at least reduces conflicting crystallization even where the barrier is amorphous, and if bcc (001) may further serve as a second templating surface, in addition to that provided by the tunneling layer (e.g., MgO).

In further embodiments, the crystallization barrier layer 112 is of a material, or stack of materials that provides sufficient direct or indirect magnetic coupling between the free magnetic layer 110 and the AEL 120 to achieve PMA within the free magnetic layer 110. In advantageous embodiments, the crystallization barrier layer 112 is further of a material offering good solubility of boron and/or offering a low boron alloy temperature, to advantageously absorb boron during a post-deposition anneal, thereby reducing the presence of boron at the interface between the free magnetic layer 110 and the tunneling layer 108 (e.g., CoFeB/MgO interface), again theorized to promote optimal crystallization during solid phase epitaxy of the free magnetic layer 110. As such, in embodiments, detectable levels of boron are present in the crystallization barrier layer 112 even where an as-deposited composition of the barrier layer does not. In embodiments, the as-deposited crystallization barrier layer 112 composition includes at least one of: Ta, Ru, tungsten (W), vanadium (V), molybdenum (Mo), niobium (Nb), or chromium (Cr). In certain such embodiments, the crystallization barrier layer 112 is composed of one of: Ta, Ru, tungsten (W), vanadium (V), molybdenum (Mo), niobium (Nb), or chromium (Cr) with Ta being an advantageous embodiment with relatively high boron solubility at moderate anneal temperatures (e.g., 300-350° C.).

Generally, the thickness of the crystallization barrier layer 112 is dependent on the exchange-coupling strength ($J_{ex}$) of the crystallization barrier layer 112, as well as the uniaxial anisotropy ($K_u$) of the AEL 120 with a higher $J_{ex}$ (mJ/m2) and a higher $K_u$ (MJ/m3) enabling a greater barrier layer thickness for a given magnetic angle out of plane (90° being perpendicular). A barrier layer composed of materials having high spin orbit-coupling (generally composed of elements of high atomic number) can be expected to be thinner than those with low spin orbit-coupling because high spin-orbit coupling reduces the exchange coupling strength. This can be seen in the FIG. 3A, where the angle of magnetization (M) in CoFeB (90 degrees being perpendicular) for barrier layer materials of different exchange-coupling strength ($J_{ex}$ of −1, −1.5, and −2.5 mJ/m2) is plotted as function of uniaxial anisotropy ($K_u$). This simulation demonstrates the effect of barrier layer thickness by calculating the magnetization angle of CoFeB for different exchange coupling strength between CoFeB (1.6 nm) and the AEL. The exchange coupling strength is known to decrease with increasing barrier thickness. The plot also shows that uniaxial anisotropy ($K_u$) of the AEL larger than 2 MJ/m$^3$ ensures magnetization of CoFeB is fully perpendicular.

Figure 3A:
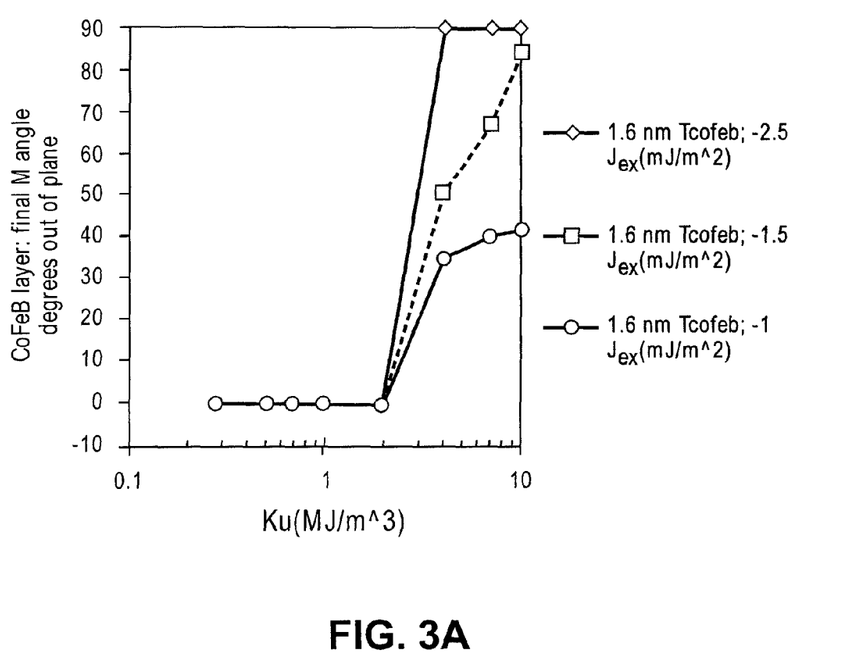
FIG. 3A illustrates plots of magnetization angle as a function of exchange coupling and magnetic anisotropic of crystallization barrier layers, in accordance with embodiments.
Figure 3B:
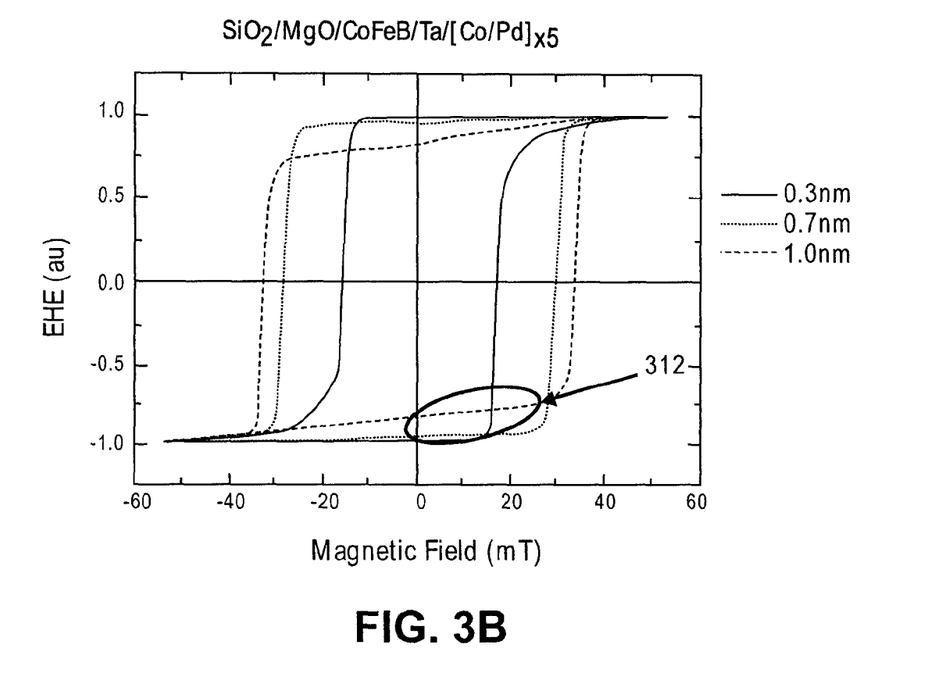
FIG. 3B illustrates plots of the extraordinary hall effect (EHE) as a function of magnetic field for a partial MTJ stack, in accordance with embodiments of the present invention.

In embodiments employing the exemplary barrier materials described elsewhere herein, the barrier thickness is between 0.1 nm and 1.3 nm. FIG. 3B illustrates plots of the resistance due to the extraordinary Hall Effect (EHE) as a function of magnetic field for a partial MTJ stack, illustrating the effect of thickness for the exemplary Ta crystallization barrier layer 112. For the EHE measurements, a partial MTJ stack including a 1.2 nm layer of CoFeB on a 1 nm layer of MgO is disposed over a silicon dioxide substrate layer. The CoFeB is separated from an AEL composed of five bilayers of 0.3 nm Co and 1.0 nm Pd by an exemplary Ta barrier layer having 0.3 nm, 0.7 nm and 1.0 nm thickness. As shown for the 1.0 nm treatment, the loop displays considerable upward slope 312 indicating the presence of in-plane magnetization within the CoFeB layer associated with a loss of coupling to the AEL. The 0.7 nm Ta barrier layer thickness however displays good squareness indicative of highly out-of-plane anisotropy and 0.3 nm Ta appearing slightly better still. As such, for an exemplary Ta embodiment of the crystallization barrier layer 112, the Ta barrier layer thickness is 0.7 nm, or less. Other barrier materials may of course be associated with other threshold thickness where coupling to the AEL becomes insufficient.

To disrupt disadvantageous templating off the AEL 120, the crystallization barrier layer 112 need only provide an interface in contact with free magnetic layer 110 having microstructure that promotes the desired post-anneal structure (e.g., CoFeB bcc (001) texture), and so barrier thickness can be minimal. However, in certain embodiments barrier layer thickness is maximized to the extent constrained by the degree of out-of-plane anisotropy of the free magnetic layer 110 (i.e., constrained by coupling to AEL) so as to enhance the ability of the barrier layer bulk to sink boron. As such, for a Ta barrier embodiment, a 0.7 nm embodiment may be advantageous has having the ability to absorb more boron than a 0.3 nm embodiment.

Figure 2B:
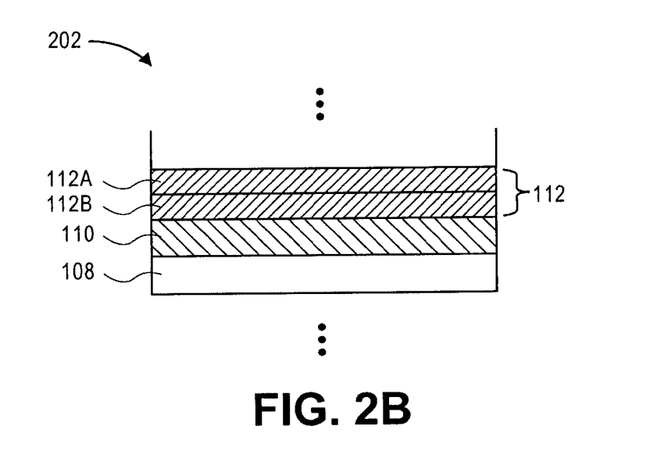
FIG. 2B illustrates an expanded cross-sectional view of a crystallization barrier layer disposed between free magnetic layer and a portion of a perpendicular MTJ, which is in a STTM device in accordance with an embodiment.

As a barrier layer may promote a desired crystallization within the free magnetic layer 110 through multiple mechanisms (e.g., interfacial template and bulk boron absorption), in further embodiments, the crystallization barrier layer 112 is a multi-layered stack amenable to separate optimization of the interfacial and bulk properties of the barrier. FIG. 2B illustrates an expanded cross-sectional view of a material stack 202 including a crystallization barrier layer 112 further divided into a first crystallization barrier layer 112A disposed on the free magnetic layer 110 and a second crystallization barrier layer 112B disposed on the first crystallization barrier layer 112A. For the first crystallization barrier layer 112A, advantageous interfacial microstructure is useful and any of the materials described elsewhere herein in the context of the crystallization barrier layer 112 (e.g., Ta) may be utilized to this end. The thickness of the first crystallization barrier layer 112A may further be advantageously minimized.

For the second crystallization barrier layer 112B, bulk properties advantageous with respect to boron absorption are useful with those materials further having lower spin orbit-coupling than that of the first crystallization barrier layer 112A being highly advantageous as permitting a greater thickness of the second barrier layer 112B and therefore greater boron absorption. In embodiments, the second crystallization barrier layer 112B has a thickness at least equal to that of the first crystallization barrier layer 112B. The combined thickness of a multi-layered barrier may be greater than that of a single material layer crystallization barrier embodiment. For example, whereas a single material layer barrier composed of Ta may be limited in layer thickness to about 0.7 nm (as shown in FIG. 3A), in a multi-layered embodiment a second barrier layer of a thickness greater than 0.4 nm (e.g., 0.6-0.8 nm) may be deposited on a first crystallization barrier layer 112A of Ta having a thickness of 0.3 nm (or less) while still achieving the level of out-of-plane anisotropy depicted in FIG. 3A for the 0.7 nm Ta barrier layer. The material(s) for the second crystallization barrier layer 112B, distal from the free magnetic layer interface, has a greater degree of freedom to be one which can sink boron (enhancing solid phase epitaxy of the free magnetic layer 110) and potentially possess lower spin orbit-coupling than do materials offering an optimal interfacial microstructure. Generally, the second crystallization barrier layer 112B may be composed of any conductive material which alloy reasonably well with boron, preferably those of low mass number. In embodiments, the second crystallization barrier layer 112B has other than bcc or amorphous structure, such as, but not limited to fcc, hcp, or tetragonal structure. In exemplary embodiments, the second crystallization barrier layer 112B comprises Cu, V, Cr, Rh, Ir, Ru.

Figure 3C:
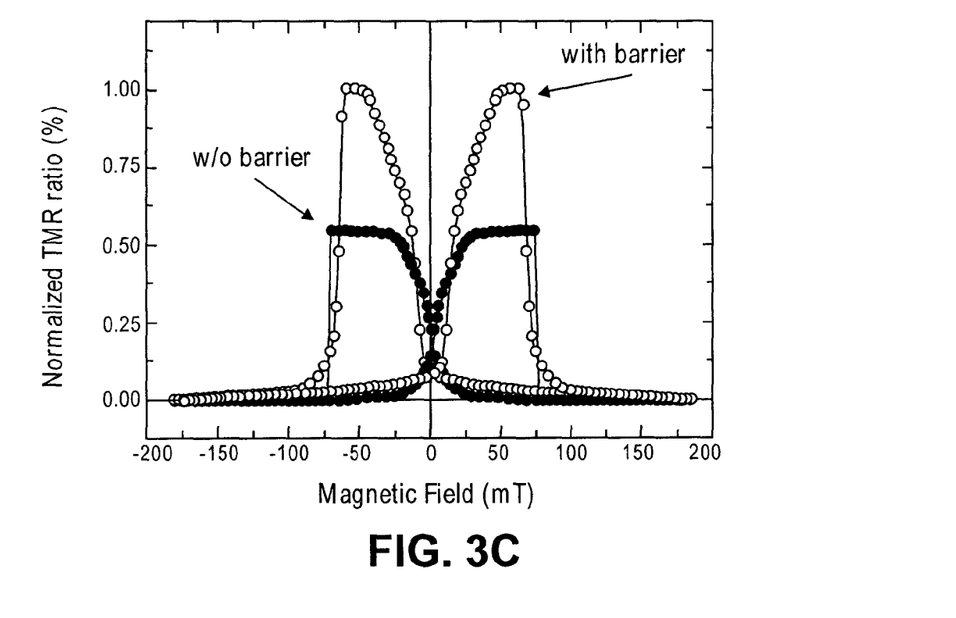
FIG. 3C illustrates a plot of TMR ratio for a perpendicular MTJ stack including a crystallization barrier layer disposed between a magnetic anisotropy enhancing layer and MTJ in accordance with an embodiment in comparison with no barrier layer.

FIG. 3C illustrates a plot of TMR ratio for a perpendicular MTJ stack including a barrier layer disposed between an AEL and MTJ in accordance with an embodiment in comparison an MTJ stack lacking a barrier layer. A normalized TMR ratio (%) is plotted as a function of magnetic field in milliTesla (mT) for two MTJ stacks which are substantially the same except for the presence of a Ta barrier layer. As shown, for an exemplary iron-rich CoFeB/MgO/CoFeB/[Co/Pd]$_{x5}$ stack, the addition of a 0.3 nm Ta barrier between the CoFeB and [Co/Pd]$_{x5}$ improves TMR by ~100%.

In exemplary embodiments, the stacks 101, 102, 201, and 202, are all formed through physical vapor deposition (PVD). One or more of co-sputter and reactive sputtering may be utilized in any capacity known in the art to form the various layer compositions described herein. After one or more of the layers (e.g., all layers) in the stacks 101, 102, 201, or 202 are deposited, an anneal is performed under any conditions known in the art to promote solid phase epitaxy of the free magnetic layer 110 following the template crystallinity of the tunneling layer 108 (e.g., MgO). Anneal temperatures, durations, and environments vary with specific embodiments performing an anneal at 250° C., or more. It is understood that the steps for fabrication further include standard microelectronic fabrication processes such as lithography, etch, thin films deposition, planarization (e.g., CMP), and/or any other processing commonly employed in microelectronic component fabrication to complete delineation and interconnection of an STTM device employing any of the stacks 101, 102, 201, and 202, or a subset of the material layers therein.

Figure 4:
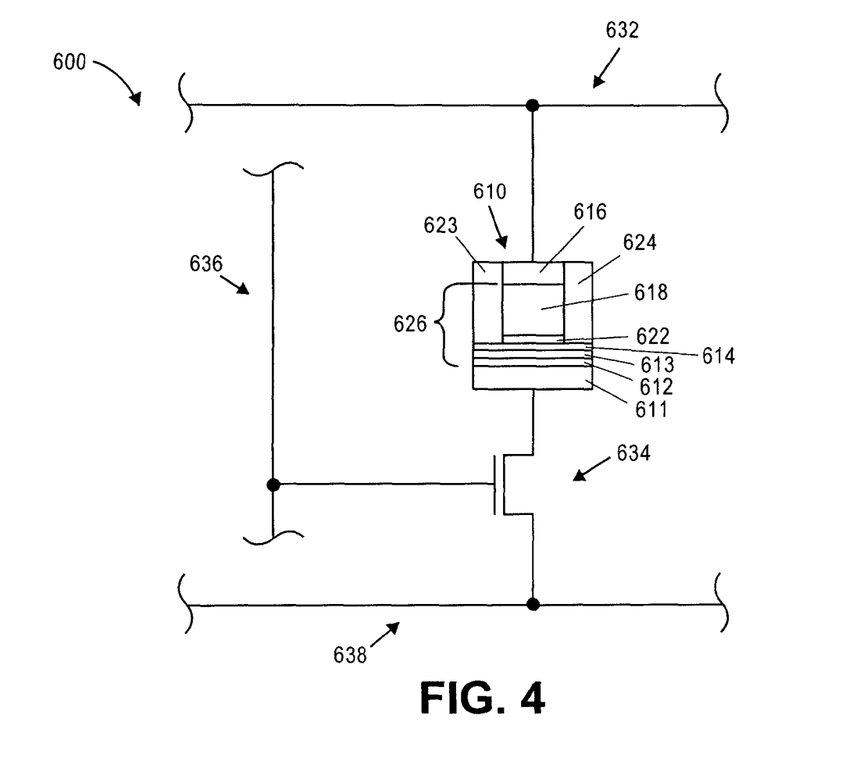
FIG. 4 illustrates a schematic of a STTM bit cell which includes a spin transfer torque element, in accordance with an embodiment of the present invention.

FIG. 4 illustrates a schematic of a spin transfer torque memory bit cell 600 which includes a spin transfer torque element 610, in accordance with an embodiment of the present invention. The spin transfer torque element 610 includes: a free magnetic layer metallization 612; a free magnetic layer 614 proximate to the free magnetic layer metallization 611 with a magnetic anisotropy enhancement layer 612 and barrier layer 613 disposed there between; a fixed magnetic layer metallization 616 proximate to a fixed magnetic layer 618; and a tunneling layer 622 disposed between the free magnetic layer 614 and the fixed magnetic layer 618, to complete the MTJ structure 626. A first dielectric element 623 and a second dielectric element 624 is disposed adjacent the fixed magnetic layer electrode 616, the fixed magnetic layer 618, and the tunneling layer 622. The fixed magnetic layer electrode 616 is electrically connected to a bit line 632. The free magnetic layer electrode 6112 is connected to a transistor 634. The transistor 634 is connected to a word line 636 and a source line 638 in any manner conventional in the art. The spin transfer torque memory bit cell 600 may further include additional read and write circuitry (not shown), a sense amplifier (not shown), a bit line reference (not shown), and the like, as will be understood by those skilled in the art of solid state non-volatile memory devices, for the operation of the spin transfer torque memory bit cell 600. It is to be understood that a plurality of the spin transfer torque memory bit cell 600 may be operably connected to one another to form a memory array (not shown), wherein the memory array can be incorporated into a non-volatile memory device.

Figure 5:
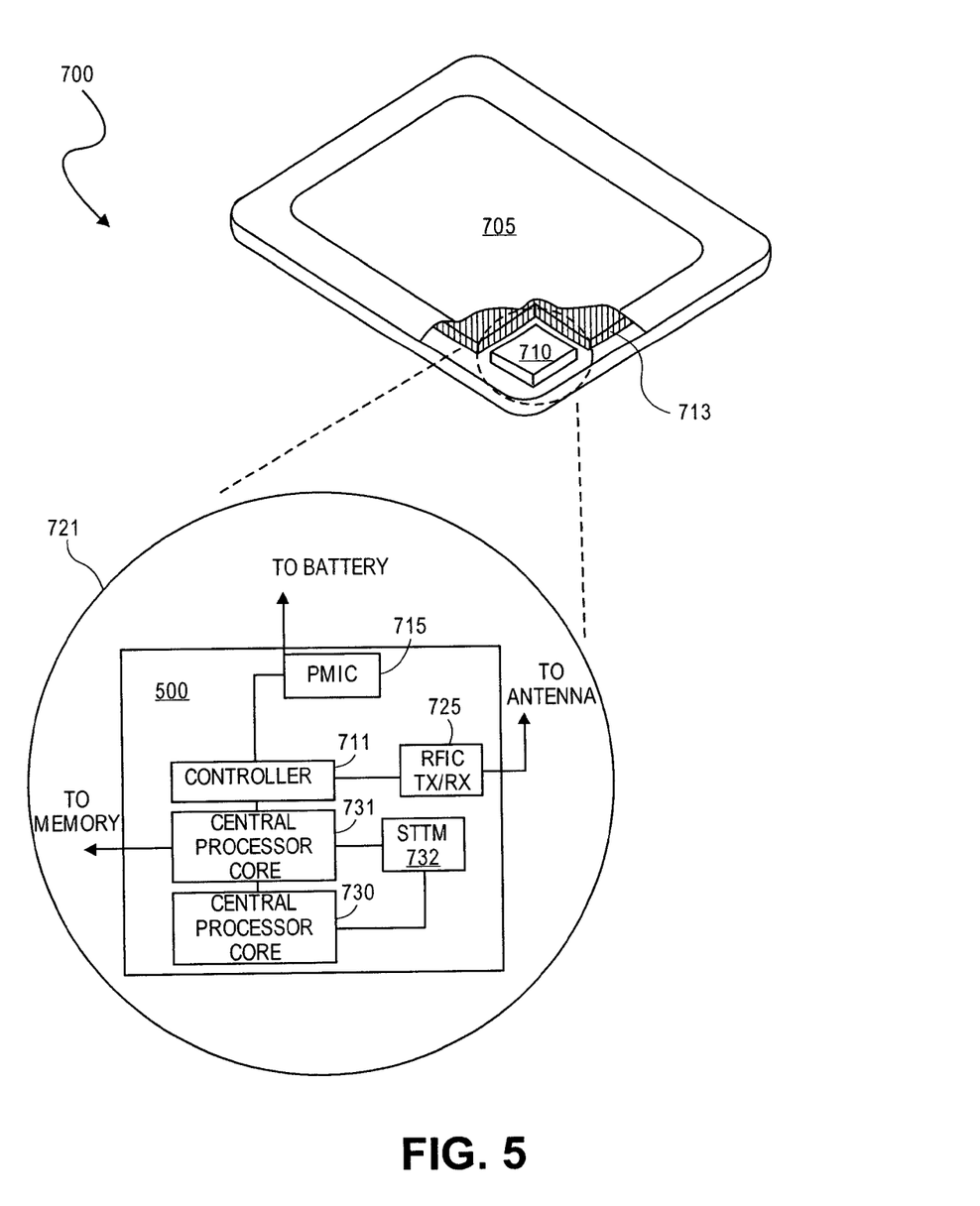
FIG. 5 illustrates an isometric view of a mobile computing device platform and schematic view of a microelectronic device employed by the mobile platform, in accordance with an embodiment of the present invention.

FIG. 5 illustrates an isometric view of a mobile computing device platform 700 and schematic view 721 of a microelectronic device 710 employed by the mobile platform, in accordance with an embodiment of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 which in the exemplary embodiment is a touchscreen (capacitive, inductive, resistive, etc.), a chip-level (SoC) or package-level integrated microelectronic device 710, and a battery 713.

The integrated device 710 is further illustrated in the expanded view 720. In the exemplary embodiment, the device 710 includes at least one memory at least one processor chip (e.g., a multi-core microprocessor and/or graphics processor cores 730, 731). In embodiments, an STTM 732, as described in more detail elsewhere herein (e.g., FIGS. 1A, 4, etc.), is integrated into the device 710. The device 710 is further coupled to the board, substrate, or interposer 500 along with, one or more of a power management integrated circuit (PMIC) 715, RF (wireless) integrated circuit (RFIC) 725 including a wideband RF (wireless) transmitter and/or receiver (e.g., including a digital baseband and an analog front end module further comprises a power amplifier on a transmit path and a low noise amplifier on a receive path), and a controller thereof 711. Functionally, the PMIC 715 performs battery power regulation, DC-to-DC conversion, etc., and so has an input coupled to the battery 713 and with an output providing a current supply to all the other functional modules. As further illustrated, in the exemplary embodiment the RFIC 725 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In implementations, each of these modules may be integrated onto a single chip as an SoC, onto separate ICs coupled to a package substrate of the packaged device 710, or at a board level.

Figure 6:
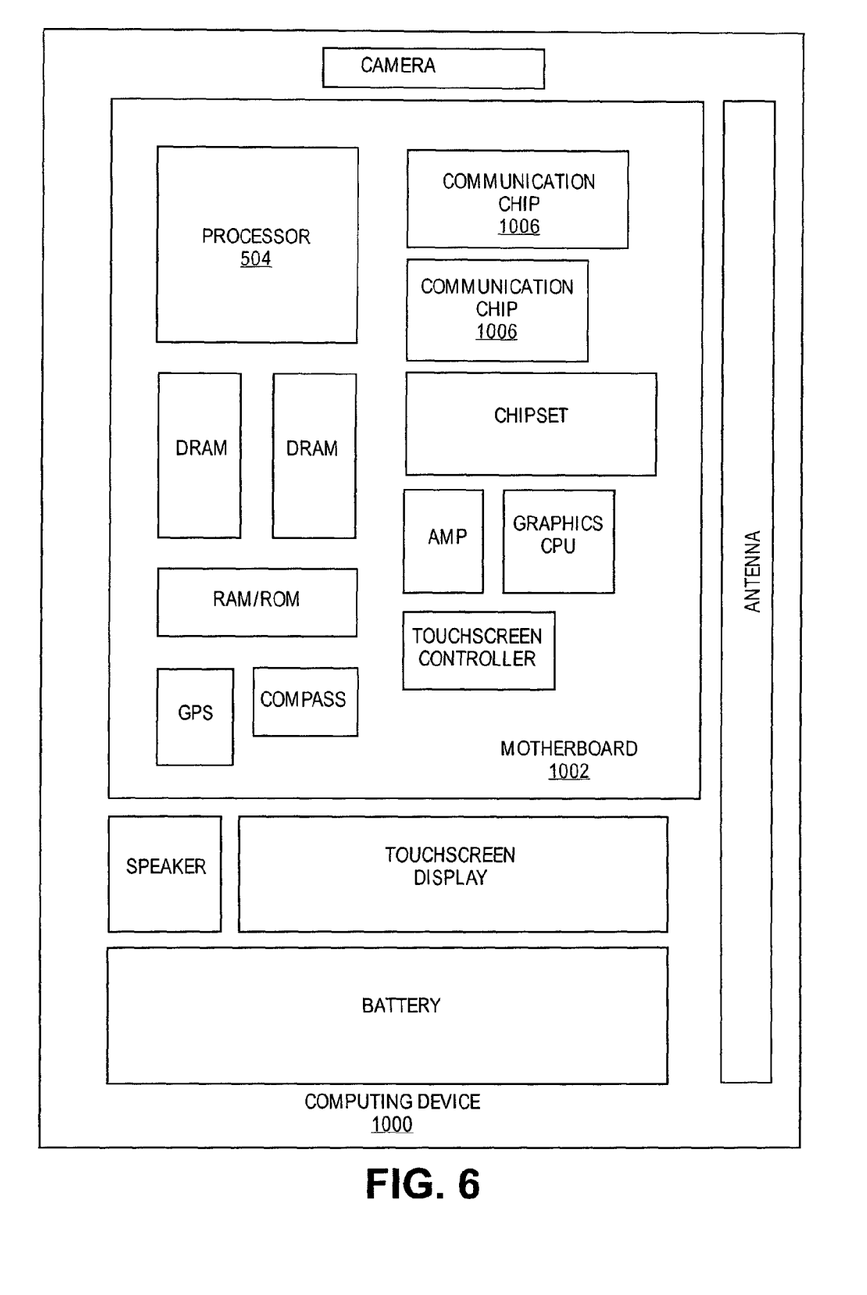
FIG. 6 illustrates a functional block diagram of computing device in accordance with one implementation of the invention.

FIG. 5 is a functional block diagram of a computing device 1000 in accordance with one embodiment of the invention. The computing device 1000 may be found inside the platform 700, for example, and further includes a board 1002 hosting a number of components, such as but not limited to a processor 504 (e.g., an applications processor) and at least one communication chip 1006. In embodiments, at least the processor 504 is integrated (e.g., on-chip) with a STTM further including an MTJ stack in accordance with embodiments describe elsewhere herein. The processor 504 is physically and electrically coupled to the board 1002. The processor 504 includes an integrated circuit die packaged within the processor 504. The term "processor" may refer to any device or portion of a device that processes electronic data from registers and/or memory to transform that electronic data into other electronic data that may be stored in registers and/or memory.

In some implementations the at least one communication chip 1006 is also physically and electrically coupled to the board 1002. In further implementations, the communication chip 1006 is part of the processor 504. Depending on its applications, computing device 1000 may include other components that may or may not be physically and electrically coupled to the board 1002. These other components include, but are not limited to, volatile memory (e.g., DRAM), non-volatile memory (e.g., RAM or ROM) in the form of flash memory or STTM, etc., a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to those described elsewhere herein. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

Accordingly, one or more embodiments of the present invention relate generally to the fabrication of microelectronic memory. The microelectronic memory may be non-volatile, wherein the memory can retain stored information even when not powered. One or more, embodiments of the present invention relate to the fabrication of a spin transfer torque memory element for non-volatile microelectronic memory devices. Such an element may be used in an embedded non-volatile memory, either for its non-volatility, or as a replacement for embedded dynamic random access memory (eDRAM). For example, such an element may be used for 1T-1X memory (X=capacitor or resistor) at competitive cell sizes within a given technology node.

In embodiments, a perpendicular magnetic tunneling junction (MTJ), includes a free magnetic layer having perpendicular magnetic anisotropy;

a fixed magnetic layer a tunneling layer disposed between the free magnetic layer and the fixed magnetic layer; a magnetic anisotropy enhancing layer disposed on a side of the free magnetic layer opposite the tunneling layer; and a crystallization barrier layer disposed between the magnetic anisotropy enhancing layer and the free magnetic layer. In embodiments, the crystallization barrier layer is in direct contact with the free magnetic layer and has a different microstructure than that of the magnetic anisotropy enhancing layer. In embodiments, the free magnetic layer and tunneling layer has (001) crystal texture, wherein the magnetic anisotropy enhancing layer includes a material layer having (111) crystal texture, and wherein the crystallization barrier layer includes a material layer with amorphous microstructure, or (001) crystal texture, forming an interface with the free magnetic layer. In embodiments, the barrier layer comprises at least one of: Ta, Ru, W, V, Mo, Nb, or Cr. In embodiments, the barrier layer further comprises Boron. In embodiments, the thickness of the barrier layer is between 0.1 nm and 1.3 nm. In embodiments, the magnetic anisotropy enhancing layer comprises a stack of magnetic and non-magnetic material layers, and wherein a magnetic layer of the stack is more proximate to the free magnetic layer than is any non-magnetic material layer of the stack. In embodiments, the tunneling layer comprises MgO or AlOx, wherein the free magnetic layer comprises iron-rich CoFeB having a thickness over 1.0 nm, and wherein the non-magnetic material layers of the stack comprise at least one of Pd, Pt, Ru, Au, or Ir and wherein the magnetic material layers of the stack comprise at least one of Co, Ni, or Fe. In embodiments, the crystallization barrier layer further includes a second material layer with a composition other than that of the material layer forming the interface with the free magnetic layer.

In embodiments, a non-volatile memory device, includes a first electrode; a fixed magnetic layer disposed over the first electrode; a free magnetic layer comprising CoFeB disposed over the fixed magnetic layer, wherein the free magnetic layer has (001) crystal texture, and a thickness greater than 1.0 nm; a tunneling layer with (001) crystal texture disposed between the free magnetic layer and the fixed magnetic layer; a magnetic anisotropy enhancing layer including a material layer having (111) crystal texture disposed on a side of the free magnetic layer opposite the tunneling layer; a crystallization barrier layer disposed between the magnetic anisotropy enhancing layer and the free magnetic layer, wherein the crystallization barrier layer includes a material layer with amorphous microstructure, or (001) crystal texture forming an interface with the free magnetic layer; a second electrode disposed over the magnetic anisotropy enhancing layer; and a transistor electrically connected to the first or the second electrode, a source line, and a word line. In embodiments, the magnetic anisotropy enhancing layer comprises a stack of magnetic and non-magnetic material layers, and wherein a magnetic layer of the stack is more proximate to the free magnetic layer than is any non-magnetic material layer of the stack. In embodiments, the barrier layer comprises at least one of Ta, Ru, W, V, Mo, Nb, or Cr and has a thickness between 0.1 nm and 1.3 nm. In embodiments, the crystallization barrier layer comprises Ta and B and has a thickness less than 0.7 nm. In embodiments, the crystallization barrier layer further includes a second material layer with a composition other than that of the material layer forming the interface with the free magnetic layer.

In embodiments, a method of forming a perpendicular magnetic tunneling junction (MTJ), includes depositing a dielectric tunneling layer with (001) crystal texture; depositing an amorphous CoFeB free magnetic layer over the tunneling layer; depositing a crystallization barrier layer over the amorphous CoFeB free magnetic layer; depositing a magnetic anisotropy enhancing layer having (111) crystal texture over the crystallization barrier layer, and annealing the dielectric tunneling layer, free magnetic layer, crystallization barrier layer, and magnetic anisotropy enhancing layer at a temperature of at least 300° C. to impart (001) crystal texture to the amorphous CoFeB free magnetic layer. In embodiments, the method includes depositing each of the dielectric tunneling layer, free magnetic layer, crystallization barrier layer, and magnetic anisotropy enhancing layer further comprises sputter deposition. In embodiments, depositing the crystallization barrier layer further comprises depositing a material layer with amorphous microstructure, or (001) crystal texture directly on the free magnetic layer. In embodiments, depositing the magnetic anisotropy enhancing layer further comprises depositing a stack of alternating magnetic and non-magnetic material layers, and wherein a magnetic layer of the stack is deposited directly on the crystallization barrier layer. In embodiments, depositing the crystallization barrier layer further comprises depositing at least one of: Ta, Ru, W, V, Mo, Nb, or Cr directly on the free magnetic layer.

Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of forming a perpendicular magnetic tunneling junction (MTJ), comprising:
   depositing a dielectric tunneling layer with (001) crystal texture;
   depositing an amorphous CoFeB free magnetic layer over the tunneling layer;
   depositing a crystallization barrier layer over the amorphous CoFeB free magnetic layer;
   depositing a magnetic anisotropy enhancing layer having (111) crystal texture over the crystallization barrier layer, and
   annealing the dielectric tunneling layer, free magnetic layer, crystallization barrier layer, and magnetic anisotropy enhancing layer at a temperature of at least 300° C. to impart (001) crystal texture to the amorphous CoFeB free magnetic layer.

2. The method of claim 1, wherein depositing each of the dielectric tunneling layer, free magnetic layer, crystallization barrier layer, and magnetic anisotropy enhancing layer further comprises sputter deposition.

3. The method of claim 2, wherein depositing the crystallization barrier layer further comprises depositing a material layer with amorphous microstructure, or (001) crystal texture directly on the free magnetic layer.

4. The method of claim 3, wherein depositing the magnetic anisotropy enhancing layer further comprises depositing a stack of alternating magnetic and non-magnetic material layers, and wherein a magnetic layer of the stack is deposited directly on the crystallization barrier layer.

5. The method of claim 3, wherein depositing the crystallization barrier layer further comprises depositing at least one of: Ta, Ru, W, V, Mo, Nb, or Cr directly on the free magnetic layer.

* * * * *